United States Patent [19]
Harada

[11] Patent Number: 5,283,450
[45] Date of Patent: Feb. 1, 1994

[54] FIT-CCD IMAGE SENSING DEVICE
[75] Inventor: Kouichi Harada, Kanagawa, Japan
[73] Assignee: Sony Corporation, Tokyo, Japan
[21] Appl. No.: 867,517
[22] Filed: Apr. 13, 1992
[30] Foreign Application Priority Data
  Apr. 15, 1991 [JP] Japan .................. 3-082597
[51] Int. Cl.$^5$ ............... H01L 29/78; H01L 27/14; H01L 31/00
[52] U.S. Cl. ............... 257/223; 257/224; 257/229; 257/232; 257/233; 257/243; 377/60; 377/62; 348/243; 348/249; 348/316
[58] Field of Search ............ 357/24 LR, 24, 223, 357/229, 230, 231, 232, 233, 224, 243; 377/60, 61, 62, 63; 358/213.16, 213.19, 213.24, 213.29

[56] References Cited
U.S. PATENT DOCUMENTS

| 4,567,524 | 1/1986 | Levine | 357/24 LR |
| 4,774,586 | 9/1988 | Koiki et al. | 357/24 LR |
| 4,985,758 | 1/1991 | Hashimoto | 357/24 LR |
| 4,987,466 | 1/1991 | Shibata et al. | 357/24 M |

OTHER PUBLICATIONS

1990 IEEE Int. Solid-State Circuits Conf. Digest of Technical Papers, 16 Feb. 1990, San Francisco, CA. U.S., pp. 214–215, 299; K. Yonemoto, et al., "A 2 Million Pixel FIT-CCD Image Sensor for HDTB Camera System", (entire document).
IEEE Transactions on Electron Devices, vol. ED-31, No. 7, Jul. 1984, New York, NY, U.S., pp. 904–909; K. Horii, et al., "A New Configuration of CCD Imager with a Very Low Smear Level—FIT-CCD Imager", p. 904, left col. –p. 907, left col.

Primary Examiner—Ngan Ngo
Attorney, Agent, or Firm—Hill, Steadman & Simpson

[57] ABSTRACT

A solid state image sensing device comprising first and second horizontal shift registers of two-phase drive system, a smear drain region disposed in an opposing relation to a first storage section of the second horizontal shift register to which the first phase drive pulse of the second horizontal shift register is applied and a channel stop region disposed in an opposing relation to a second storage section of the second horizontal shift register to which the second phase drive pulse is applied, wherein a smear component is drained to the smear drain region, and a hole component is drained to the channel stop region for thereby reducing a dark current of the second horizontal shift register to about that of the first horizontal shift register. Therefore, a dark current in the horizontal shift register of the solid state image sensing device can be reduced.

7 Claims, 5 Drawing Sheets

FIT-CCD IMAGE SENSING DEVICE

BACKGROUND OF THE INVENTION

1. Field of the Invention

The present invention relates generally to solid state image sensing devices and, more particularly to improvements of a dark current of a horizontal shift register in an output section of the solid state image sensing device.

2. Description of the Prior Art

FIGS. 1 and 2 of the accompanying drawings show an example of a vertical FIT (frame interline) type solid state image sensing device according to the prior art.

As shown in FIGS. 1 and 2, a conventional vertical FIT type solid state image sensing device generally depicted by reference numeral 12 comprises an image sensing section 1, a storage section 2 and an output section, i.e., a horizontal shift register section 3 of a CCD (charge-coupled device) structure. The image sensing section 1 comprises a number of photo-sensing elements 4, each forming a pixel, arrayed in a matrix fashion and a vertical shift register 5 of CCD structure disposed on one side of each vertical column of the photo-sensing elements 4 so as to transfer signal charges of the photo-sensing elements 4 in the vertical direction. The storage section 2 is disposed under the image sensing section 1 in the vertical direction to temporarily store signal charges generated from the image sensing section 1. The storage section 2 comprises a plurality of vertical shift registers 6 of similar CCD structure which corresponds to the respective vertical shift registers 5 of the image sensing section 1 in a one-to-one relation. The vertical shift register 5 of the image sensing section 1 and the vertical shift register 6 of the storage section 2 are both driven according to the 4-phase drive system which is controlled by four-phase drive pulses $\Phi IM_1$, $\Phi IM_2$, $\Phi IM_3$, $\Phi IM_4$ and $\Phi ST_1$, $\Phi ST_2$, $\Phi ST_3$, $\Phi ST_4$, for example. The horizontal shift register section 3 of the output section is driven according to the two-phase drive system which is controlled by two-phase drive pulses $\Phi H_1$ and $\Phi H_2$, for example.

In the high definition (very high resolution) solid state image sensing device, the horizontal shift register section 3 comprises two horizontal shift registers 3A and 3B disposed in parallel in order to reduce a horizontal transfer frequency. In the horizontal shift registers 3A and 3B, as shown in FIG. 2, a first storage unit $st_1$, a first transfer unit $tr_1$, a second storage unit $st_2$ and a second transfer unit $tr_2$ constitute one bit. A transfer section composed of the first storage unit $st_1$ and the transfer unit $tr_1$ to which there is applied the drive pulse $\Phi H_1$ corresponds to every other vertical shift register 6A and a transfer section composed of the second storage unit $st_2$ and second transfer unit $tr_1$ to which there is applied the drive pulse $\Phi H_2$ corresponds to remaining every other vertical shift register 6B. A transfer gate section 7 for transferring electric charges from the storage section 2 to the horizontal shift register section 3 is provided between the vertical shift register 6 (6A, 6B) of the storage section 2 and the horizontal shift register section 3. A transfer gate section 8 for transferring electric charges from the first horizontal shift register 3A to the second horizontal shift register 3B is provided between the first horizontal shift register 3A and the second horizontal shift register 3B. Further, a smear drain region 10 is provided under the second horizontal shift register 3B and extended over the full length of the second horizontal shift register 3B in order to discharge a smear component through a smear gate unit 9. Hatched areas 11 in FIG. 2 represent channel-stop regions, respectively.

This vertical FIT type solid state image sensing device 12 effects a high speed sweep transfer during a vertical blanking period to sweep smear components of the vertical shift registers 5, 6 to the smear drain region 10. Thereafter, signal charges in the photo-sensing elements 4 are transferred from the image sensing section 1 to the storage section 2 and temporarily stored therein. Then, at every horizontal blanking period, the signal charges of every horizontal line are distributed into the first and second horizontal shift registers 3A and 3B of the horizontal shift register section 3 from the storage section 2. That is, the signal charge in the vertical shift register 6A is transferred to the second horizontal shift register 3B and the signal charge in the vertical shift register 6B is transferred to the first horizontal shift register 3A. The signal charges of one horizontal line transferred to the first and second horizontal shift registers 3A, 3B are transferred within the first and second horizontal shift registers 3A, 3B in the horizontal direction and sequentially and alternately output through a switching means 13.

The above-mentioned FIT type solid state image sensing device 12 has the drawback such that a dark current of the second horizontal shift register 3B is very much large as compared with that of the first horizontal shift register 3A. A cause of this drawback is considered as follows:

A hole (positive hole), which causes a dark current, is transferred to the horizontal shift register section 3 in the same direction as that of the smear component (electron) because the vertical shift registers 5, 6 are driven by the four-phase drive system. In addition, the smear drain region 10 disposed under the second horizontal shift register 3B acts as a barrier against the hole so that the hole remaining in the second horizontal shift register 3B cannot be smoothly drained to the channel stop region 11.

OBJECTS AND SUMMARY OF THE INVENTION

Therefore, it is an object of the present invention to provide an improved solid state image sensing device in which the aforesaid shortcomings and disadvantages of the prior art can be eliminated.

More specifically, it is an object of the present invention to provide a solid state image sensing device in which a dark current in a horizontal shift register in an output section can be reduced.

It is another object of the present invention to provide a solid state image sensing device which can improve a resolution.

As an aspect of the present invention, a solid state image sensing device having an output section formed of a horizontal shift register of a two-phase drive system and a smear drain region disposed in an opposing relation to the horizontal shift register comprises a smear drain region opposing a transfer section to which there is applied a first drive pulse of the horizontal shift register and a channel stop region opposing a transfer section to which there is applied a second drive pulse.

In accordance with the present invention, since the smear drain region and the channel stop region are alternately provided for the horizontal shift register of the two-phase drive system, a smear component is drained to the smear drain region and a hole component, which causes a dark current, is drained to the channel stop region, for thereby reducing a dark current in the horizontal shift register.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

A solid state image sensing device 33 according to an embodiment of the present invention will now be described with reference to FIGS. 3 through 6.

Figure 1:
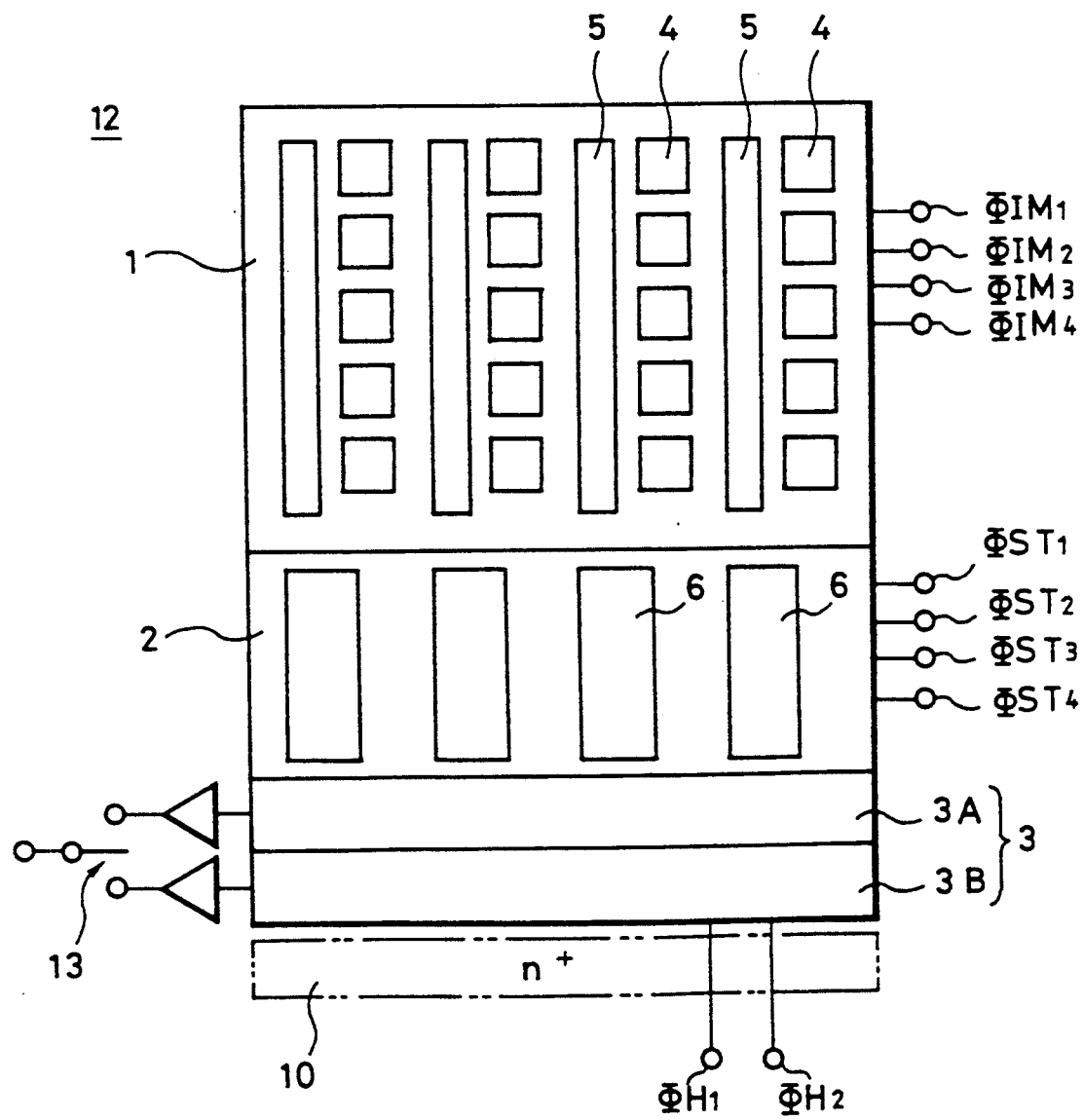
FIG. 1 is a schematic diagram showing an example of a vertical FIT (frame interline) type solid state image sensing device according to the prior art.
Figure 2:
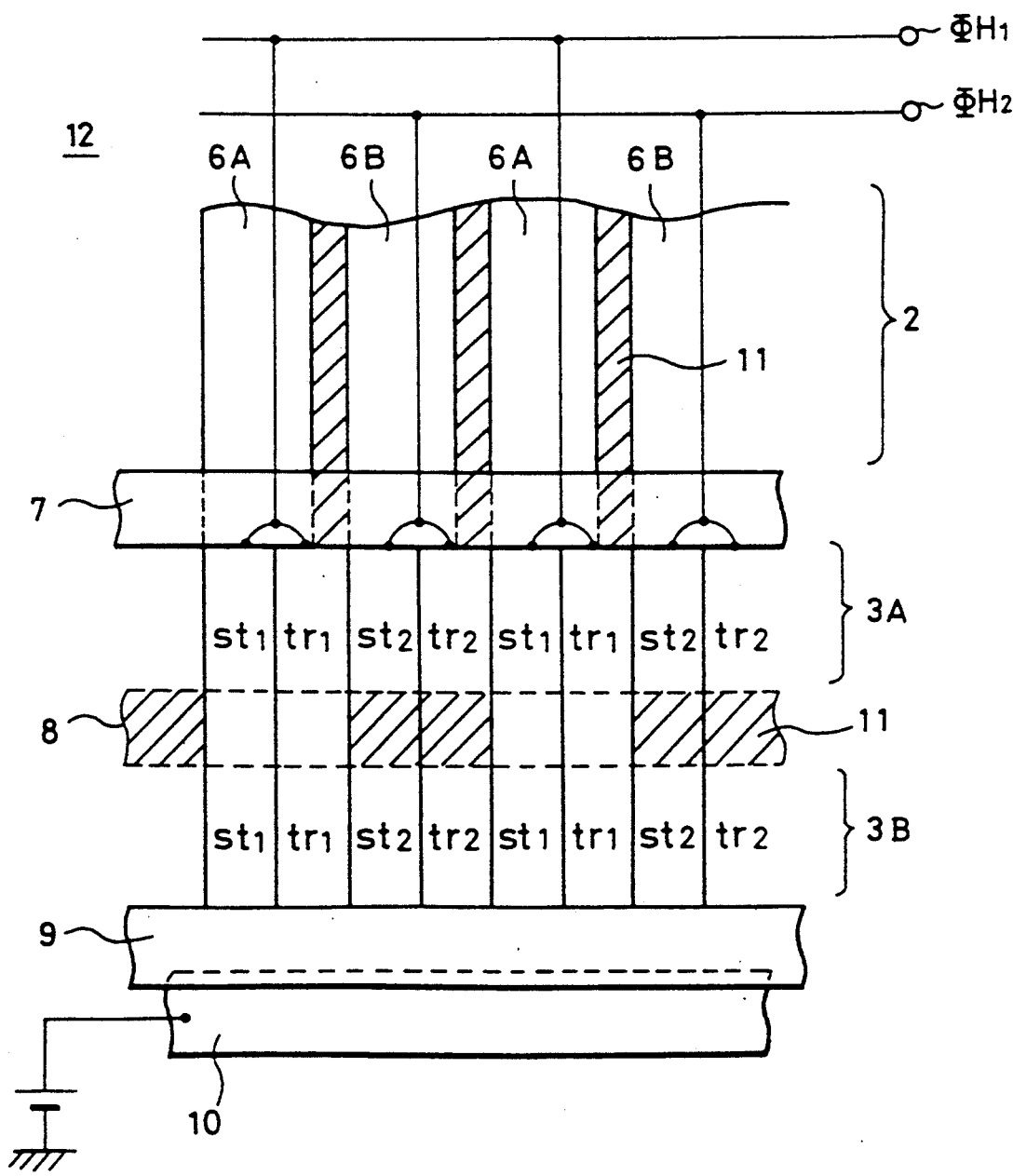
FIG. 2 is a plan plane view illustrating a main portion of the conventional solid state image sensing device shown in FIG. 1.
Figure 3:
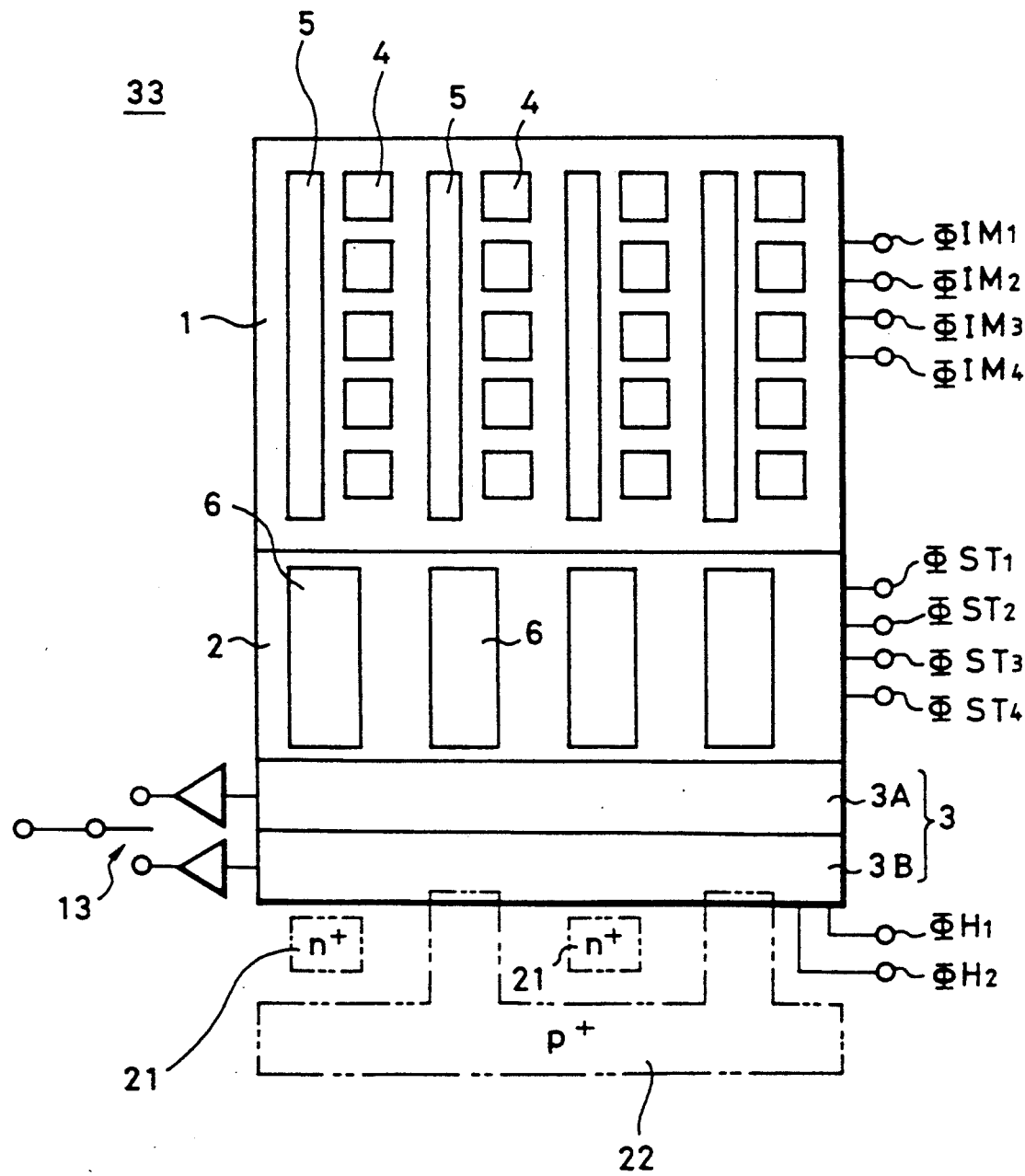
FIG. 3 is a schematic diagram showing an embodiment of a solid state image sensing device according to the present invention.
Figure 4:
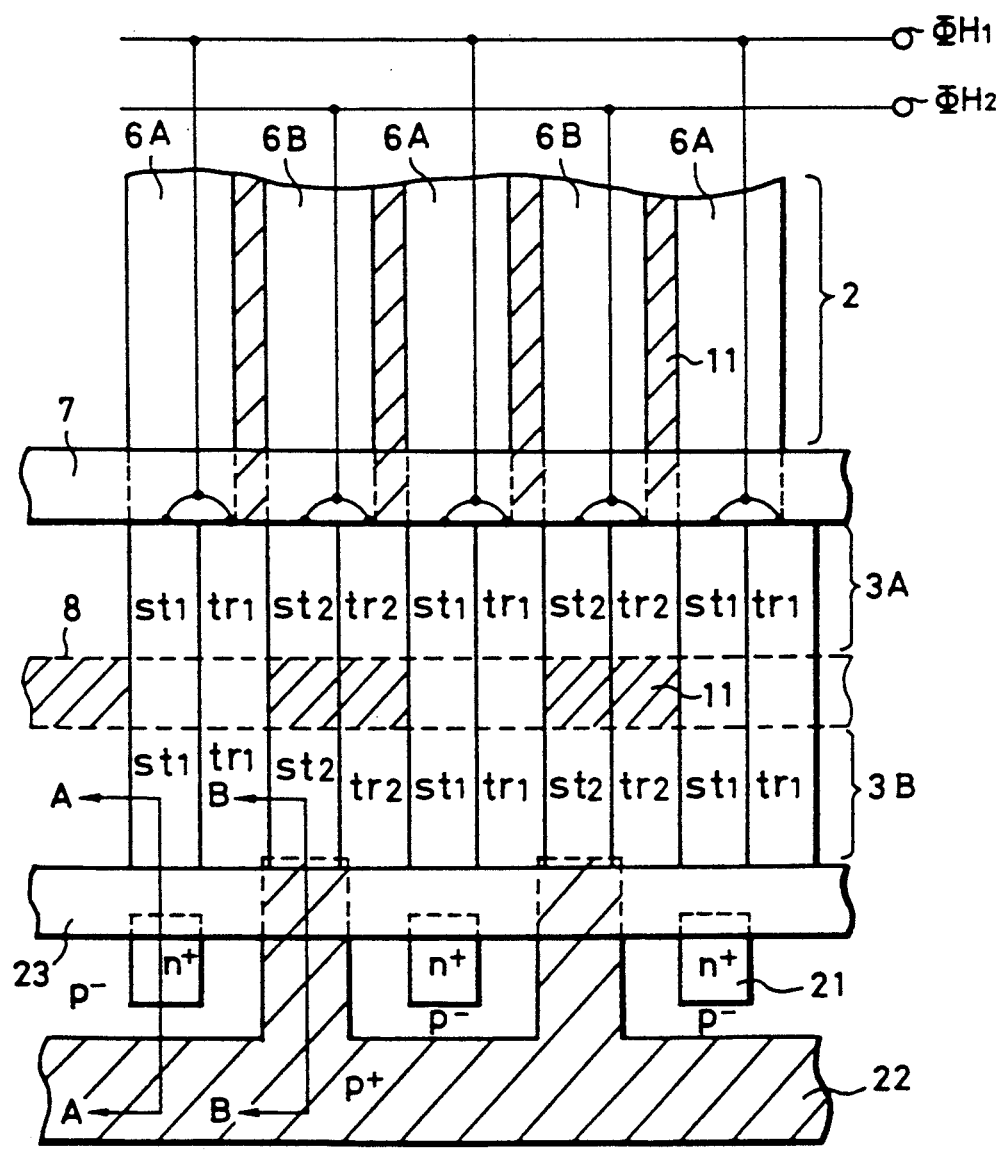
FIG. 4 is a plan view illustrating a main portion of the solid state image sensing device shown in FIG. 3.

FIG. 3 of the accompanying drawings shows a schematic arrangement of the solid state image sensing device according to the present invention which is applied to the vertical FIT type solid state image sensing device for high definition. FIG. 4 shows a plane view of a main portion of a horizontal shift register section thereof.

Referring to FIG. 3, the solid state image sensing device of the present invention comprises an image sensing section 1, a storage section 2 and a horizontal shift register section 3 formed of first and second horizontal shift registers 3A, 3B of CCD structure disposed in parallel to each other. The image sensing section 1 comprises a plurality of photo-sensing elements 4 arrayed in a matrix fashion and a vertical shift register 5 of CCD structure disposed on one side of each vertical column of the photo-sensing elements 4 so as to transfer signal charges of the photo-sensing elements 4 in the vertical direction. Also, the storage section 2 comprises a plurality of vertical shift registers 6 (6A, 6B) of CCD structure opposing to the vertical shift registers 5 of the image sensing section 1 in a one-to-one relation.

The vertical shift registers 5 and 6 are respectively driven according to the four-phase drive system which is controlled by four-phase drive pulses $\Phi IM_1$, $\Phi IM_2$, $\Phi IM_3$, $\Phi IM_4$, and $\Phi ST_1$, $\Phi ST_2$, $\Phi ST_3$, $\Phi ST_4$, for example. The first and second horizontal shift registers 3A, 3B of the horizontal shift register section 3 are driven according to the two-phase drive system which is controlled by two-phase drive pulses $\Phi H_1$, $\Phi H_2$. As shown in FIG. 4, the first and second horizontal shift registers 3A and 3B are respectively composed of a first storage unit $st_1$, a first transfer unit $tr_1$, a second storage unit $st_2$, and a second transfer unit $tr_2$. For example, the first storage unit $st_1$ and the first transfer unit $tr_1$ to which the first phase drive pulse $\Phi H_1$ is applied are disposed in correspondence with every other vertical shift register 6A while the second storage unit $st_2$ and the second transfer unit $tr_2$ to which the second phase drive pulse $\Phi H_2$ is applied are disposed in correspondence with remaining every other remaining vertical shift register 6B, respectively. A transfer gate section 7 for transferring signal charges from the storage section 2 to the horizontal shift register section 3 is disposed between the vertical shift register 6 of the storage section 2 and the first horizontal shift register 3A.

Further, a transfer gate section 8 for transferring a signal charge corresponding to every other vertical shift register 6 through the first horizontal shift register 3A to the second horizontal shift register 3B is disposed between the first and second horizontal shift registers 3A and 3B. Hatched areas 11 in the storage section 2 and in the transfer gate section 8 depict P+ channel stop regions.

According to the embodiment of the present invention, an n+ smear drain region 21 to which a predetermined positive voltage is applied is formed under the second horizontal shift register 3B in an opposing relation to each of the first storage units $st_1$. Also, a p+ channel stop region 22 to which a predetermined voltage, e.g., 0V is applied is formed in abutment against each of the second storage units st2 in order to inhibit the transfer of signal charge in the vertical direction and a smear gate section 23 is formed between the second horizontal shift register 3B and the smear drain region 21.

Figure 5:
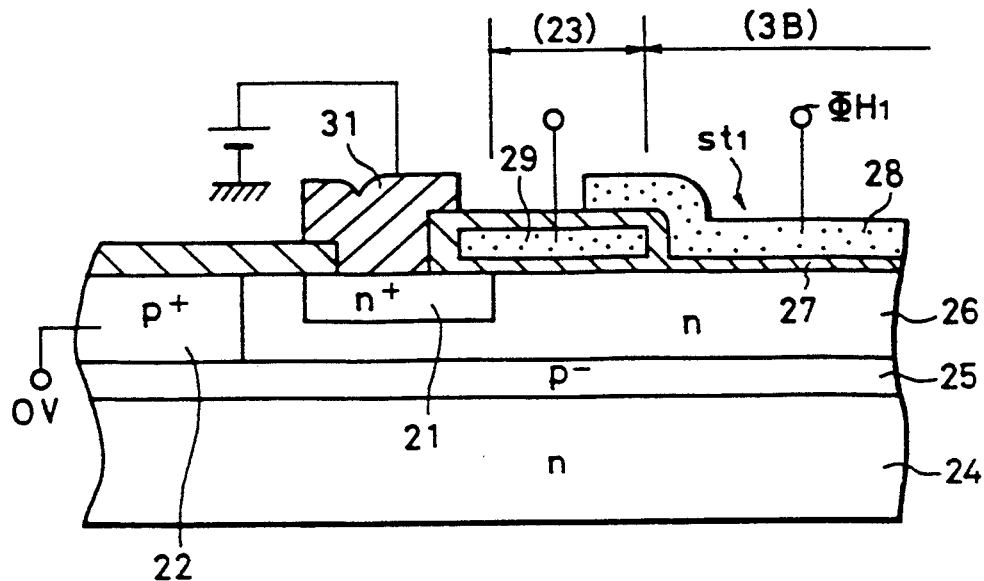
FIG. 5 is a cross-sectional view taken through the line A—A in FIG. 4.
Figure 6:
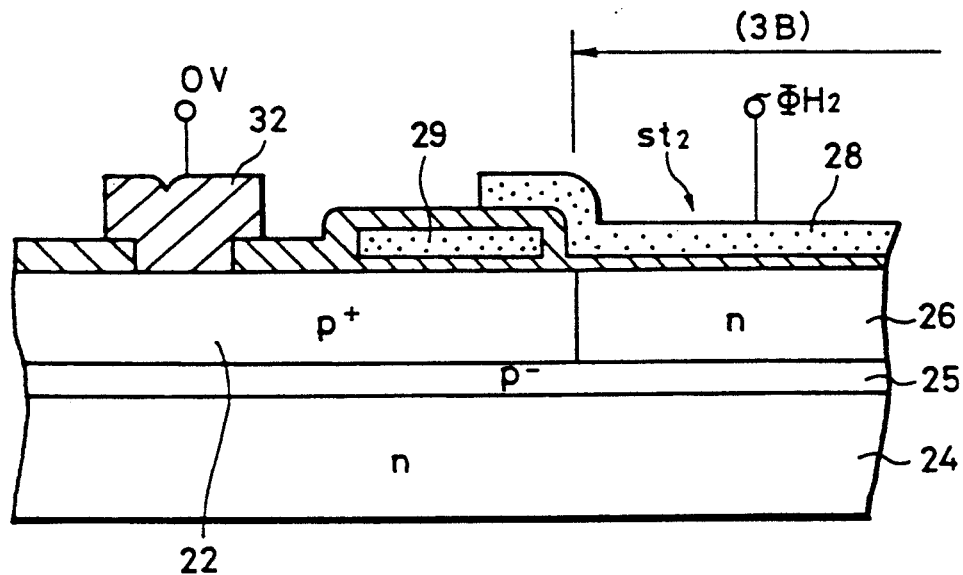
FIG. 6 is a cross-sectional view taken through the line B—B in FIG. 4.

FIGS. 5 and 6 are cross-sectional views, respectively, taken through line A—A and through line B—B in FIG. 4.

As illustrated, an n type buried channel region 26 is formed within a p- well region 25 formed on one major surface of an n-type semiconductor substrate 24, and a transfer electrode 28 made of a polycrystalline silicon, for example, is formed on this buried channel region 26 through a gate insulating layer 27, thereby the second horizontal shift register 3B being formed. The n+ smear drain region 21 is formed on the buried channel region 26 in an opposing relation to the first storage unit $st_1$ of the second horizontal shift register 3B, and a smear gate electrode 29 made of a polycrystalline silicon is formed on the buried channel region 26 between the smear drain region 21 and the horizontal shift register 3B through the gate insulating layer 27 for thereby forming the smear gate section 23. Whereas, the p+ channel stop region 22 is formed in contact with the second storage unit st2 of the second horizontal shift register 3B. In FIGS. 5 and 6, reference numeral 31 depicts an electrode coupled to the smear drain region 21 in ohmic contact and 32 an electrode coupled to the channel stop region 22 in ohmic contact.

Operation of the FIT type solid state image sensing device 33 thus constructed will be described below.

Initially, during the vertical blanking period, the transfer gate sections 7, 8 and the smear gate section 23 are turned on. Then, under the condition such that the drive pulses $\Phi H_1$, $\Phi H_2$ of the horizontal shift register section 3 are set at high level, the vertical shift registers 5, 6 are driven at high speed to transfer the smear components within the vertical shift registers 5, 6 of the image sensing section 1 and the storage section 2 to the horizontal shift register section 3 side at high speed, thereby being drained to the smear drain region 21.

After the smear components are removed, the signal charge is temporarily stored in the storage section 2.

More specifically, at a timing point in which the smear component of the vertical shift register 6 in the storage section 2 is transferred to the horizontal shift register section 3 at high speed and in which the smear component of the vertical shift register 5 of the image sensing section 1 is transferred to the storage section 2 at high speed, the signal charge at the photosensing element 4 is transferred to the vertical shift register 5 of the image sensing section 1. After the smear component within the storage section 2 is transferred to the horizontal shift register section 3, the transfer gate section 7 is turned off and the signal charge is transferred from the vertical shift register of the image sensing section 1 to the storage section 2 and temporarily stored therein. In the horizontal shift register section 3 side, the smear component within every other vertical shift register 6A is drained through the first storage units $st_1$ of the first and second horizontal shift registers 3A and 3B to the smear drain region 21. The smear component of every other remaining vertical shift register 6B is temporarily transferred to the second storage unit $st_2$ of the first horizontal shift register 3A and transferred by half bit because the second drive pulse $\Phi H_2$ goes to low level after the transfer gate section 8 is turned off. As a consequence, this smear component is transferred to and drained to the smear drain region 21 from the first storage unit $st_1$ of the first horizontal shift register 3A through the first storage unit $st_1$ of the second horizontal shift register 3B.

On the other hand, since the vertical shift registers 5, 6 are driven by the four-phase drive system, the hole component transferred to the horizontal shift register section 3 side together with the smear component is temporarily transferred to the first storage unit $st_1$ of the second horizontal shift register 3B, then transferred in the right-hand side of the figures of the drawings when the horizontal shift registers are driven by the drive pulses $\Phi H_1$, $\Phi H_2$, thereby being drained to the channel stop region 22 to which 0V is applied through the second storage unit $st_2$. In the two-phase drive system, the electron and the hole (positive hole) are transferred in the directions opposite to each other. Incidentally, since the channel stop region 11 formed under the transfer gate section 8 of the first and second horizontal shift registers 3A and 3B is in the floating condition from a potential standpoint, the hole component is inhibited from being drained in the channel stop region 11.

As described above, according to this embodiment, the hole component can be drained without deteriorating the capability of the smear drain and hence the dark current of the second horizontal shift register 3B can be reduced to about the dark current of the first horizontal shift register 3A.

While the present invention is applied to the FIT type solid state image sensing device having the two horizontal shift registers 3A and 3B, the present invention is not limited thereto and can be similarly applied to an FIT type solid state image sensing device having a single horizontal shift register or having two horizontal shift registers or more. In this case, it is sufficient that the smear drain region 21 is provided in association with the transfer section to which the first phase drive pulse is applied and that the channel stop region 22 is provided in association with the transfer section to which the second phase drive pulse is applied.

According to the present invention, since the hole component, which causes the dark current, can be eliminated without deteriorating the drain capability of smear component, the dark current in the horizontal shift register in the output section can be reduced. Particularly in the high definition solid state image sensing device having two horizontal shift registers or more, the dark current in each of the horizontal shift registers can be both reduced to about the same degree, thereby the solid state image sensing device of high definition being made.

Having described the preferred embodiment with reference to the accompanying drawings, it is to be understood that the invention is not limited to that precise embodiment and that various changes and modifications thereof could be effected by one skilled in the art without departing from the spirit or scope of the invention as defined in the appended claims.

What is claimed is:

1. A solid state image sensing device comprising:
   (a) an image sensing section composed of a photosensing section for photoelectric-converting an incident light into a signal charge and a vertical shift register for transferring said signal charge in the vertical direction;
   (b) a horizontal shift register of a two-phase drive system having a first transfer unit and a first storage unit to which said signal charge of said image sensing section is transferred through a gate and which is supplied with a drive pulse of a first phase and a second transfer unit and a second storage unit to which a drive pulse of a second phase is supplied;
   (c) a smear drain region disposed on a side of said horizontal shift register opposite to said image sensing section and associated with said first storage unit;
   (d) a smear gate disposed between said smear drain region and said first storage unit; and
   (e) a channel stop region associated with said second storage unit and disposed in abutment with said second storage unit and on a side of said smear drain region opposite to said horizontal shift register.

2. The solid state image sensing device according to claim 1, wherein said horizontal shift register is comprised of first and second horizontal shift register units disposed in parallel to each other, a transfer gate unit disposed between said first and second horizontal shift register units and switching means disposed on output sides of the first and second horizontal shift register units for alternately outputting signal charges of said first and second horizontal shift register units.

3. The solid state image sensing device according to claim 1, wherein said first transfer unit supplied with said drive pulse of first phase and said second transfer unit supplied with said drive pulse of second phase are alternately disposed, each of said storage units having a storage electrode and each of said transfer units having a transfer electrode, said smear drain region is formed at a position corresponding to said storage electrode of said first storage unit to which said drive pulse of first phase is supplied.

4. The solid state image sensing device according to claim 3, wherein said smear drain region is supplied with a predetermined bias voltage.

5. The solid state image sensing device according to claim 3, wherein said channel stop region is supplied with a reference voltage.

6. The solid state image sensing device according to claim 5, further comprising a storage section for temporarily storing the signal charge of said image sensing section, said signal charge in said storage section being transferred through said gate to said horizontal shift register.

7. The solid state image sensing device according to claim 1, wherein a smear component generated in said image sensing section is drained to said smear drain region and a hole component generated in said image sensing section is drained to said channel stop region.

* * * * *